US006875626B2

(12) United States Patent
Derraa

(10) Patent No.: US 6,875,626 B2
(45) Date of Patent: Apr. 5, 2005

(54) FIELD EMISSION ARRAYS AND METHOD OF FABRICATING SAME TO OPTIMIZE THE SIZE OF GRID OPENINGS AND TO MINIMIZE THE OCCURRENCE OF ELECTRICAL SHORTS

(75) Inventor: Ammar Derraa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/615,548

(22) Filed: Jul. 8, 2003

(65) Prior Publication Data

US 2004/0023592 A1 Feb. 5, 2004

Related U.S. Application Data

(63) Continuation of application No. 10/114,492, filed on Apr. 2, 2002, now Pat. No. 6,589,803, which is a continuation of application No. 09/788,984, filed on Feb. 20, 2001, now Pat. No. 6,403,390, which is a continuation of application No. 09/260,708, filed on Mar. 1, 1999, now Pat. No. 6,197,607.

(51) Int. Cl.[7] .......... H01L 21/00
(52) U.S. Cl. .......... 438/20; 445/24
(58) Field of Search .......... 438/20, 34, 692; 445/24; 313/309

(56) References Cited

U.S. PATENT DOCUMENTS

| | | | | |
|---|---|---|---|---|
| 4,943,343 A | | 7/1990 | Bardai et al. | |
| 5,057,047 A | * | 10/1991 | Greene et al. | 438/20 |
| 5,229,331 A | | 7/1993 | Doan et al. | |
| 5,372,973 A | | 12/1994 | Doan et al. | |
| 5,534,743 A | | 7/1996 | Jones et al. | |
| 5,585,301 A | | 12/1996 | Lee et al. | |
| 5,632,664 A | | 5/1997 | Scoggan et al. | |
| 5,653,619 A | | 8/1997 | Cloud et al. | |
| 5,696,385 A | | 12/1997 | Song et al. | |
| 5,712,534 A | | 1/1998 | Lee et al. | |
| 5,727,976 A | | 3/1998 | Nakamoto et al. | |
| 5,735,721 A | | 4/1998 | Choi | |
| 5,791,962 A | | 8/1998 | Liu et al. | |
| 6,064,149 A | | 5/2000 | Raina | |
| 6,066,507 A | | 5/2000 | Rolfson et al. | |
| 6,075,315 A | | 6/2000 | Seko et al. | |
| 6,139,385 A | | 10/2000 | Raina | |
| 6,190,223 B1 | | 2/2001 | Tjaden et al. | |
| 6,197,607 B1 | | 3/2001 | Derraa | |
| 6,271,139 B1 | * | 8/2001 | Alwan et al. | 438/692 |

* cited by examiner

*Primary Examiner*—Tuan H. Nguyen
(74) *Attorney, Agent, or Firm*—TraskBritt

(57) ABSTRACT

A method for fabricating a field emission structure is disclosed. A first dielectric layer and a second material layer are disposed over a substrate and at least one emitter tip thereon. Planarization of the second layer exposes regions of the first layer that cover the emitter tip, which regions may then be removed through the second layer. Substantial removal of the second layer reduces any conductive defects that protrude from a surface of the first layer. A third, dielectric layer and fourth, grid layer are then formed. Planarization of the fourth layer forms grid openings and exposes dielectric material of the third layer which overlies the emitter tip. Dielectric material of one or both underlying layers may then be removed to expose the outer surfaces of the emitter tip.

12 Claims, 8 Drawing Sheets

FIELD EMISSION ARRAYS AND METHOD OF FABRICATING SAME TO OPTIMIZE THE SIZE OF GRID OPENINGS AND TO MINIMIZE THE OCCURRENCE OF ELECTRICAL SHORTS

CROSS-REFERENCE TO RELATED APPLICATIONS

This application is a continuation of application Ser. No. 10/114,492, filed Apr. 2, 2002, now U.S. Pat. No. 6,589,803, issued Jul. 8, 2003, which is a continuation of application Ser. No. 09/788,984, filed Feb. 20, 2001, now U.S. Pat. No. 6,403,390, issued Jun. 11, 2002, which is a continuation of application Ser. No. 09/260,708, filed Mar. 1, 1999, now U.S. Pat. No. 6,197,607, issued Mar. 6, 2001.

STATEMENT REGARDING FEDERALLY SPONSORED RESEARCH OR DEVELOPMENT

This invention was made with Government support under Contract No. ARPA-95-42 MD T-00062 awarded by Advanced Research Projects Agency (ARPA). The Government has certain rights in this invention.

BACKGROUND OF THE INVENTION

1. Field of the Invention

The present invention relates to methods of fabricating field emission arrays including planarized grids. Particularly, the present invention relates to field emission array fabrication methods that facilitate optimization of the size of grid openings above each of the emitter tips thereof. The present invention also relates to field emission arrays fabricated in accordance with the method of the present invention.

2. Background of Related Art

Typically, field emission displays ("FEDs") include an array of pixels, each of which includes one or more substantially conical emitter tips. The array of pixels of a field emission display is typically referred to as a field emission array. Each of the emitter tips is electrically connected to a negative voltage source by means of a cathode conductor line, which is also typically referred to as a column line.

Another set of electrically conductive lines, which are typically referred to as row lines or as gate lines, extends over the pixels of the field emission array. Row lines typically extend across a field emission display substantially perpendicularly to the direction in which the column lines extend. Accordingly, the paths of a row line and of a column line typically cross proximate (e.g., above and below, respectively) the location of an emitter tip. The row lines of a field emission array are electrically connected to a relatively positive voltage source. Thus, as a voltage is applied across the column line and the row line, electrons are emitted by the emitter tips and accelerated through an opening in the row line.

As electrons are emitted by emitter tips and accelerate past the row line that extends over the pixel, the electrons are directed toward a corresponding pixel of a relatively positively charged electro-luminescent panel of the field emission display, which is spaced apart from and substantially parallel to the field emission array. As electrons impact a pixel of the electro luminescent panel, the pixel is illuminated. The degree to which the pixel is illuminated depends upon the number of electrons that impact the pixel.

An exemplary method of fabricating field emission arrays is taught in U.S. Pat. No. 5,372,973 (hereinafter "the '973 Patent"), issued to Trung T. Doan et al. on Dec. 13, 1994. The field emission array fabrication method of the '973 Patent includes an electrically conductive grid, or gate, disposed over the surface thereof and including apertures substantially above each of the emitter tips of the field emission array. While the electrically conductive grid of the field emission array disclosed in the '973 Patent is fabricated from an electrically conductive material such as chromium, field emission arrays that include grids of semiconductive material, such as silicon, are also known. Known processes, including chemical mechanical planarization ("CMP") and a subsequent mask and etch, are employed to provide a substantially planar grid surface and to define grid openings or apertures therethrough, which are positioned above each of the emitter tips.

The process of the '973 Patent is, however, somewhat undesirable in that upon optimization of either the thickness of the dielectric layer or the diameters of the grid openings, the other may not be optimized. Moreover, as the process of the '973 Patent employs layers of dielectric material that are subsequently covered by a grid material without any intervening process steps (e.g., planarization of any imperfections and disposal of another layer of dielectric material thereover), electrically conductive imperfections that may extend through the dielectric material from the substrate to the grid are typically not removed by intervening process steps.

Accordingly, there is a need for a field emission array fabrication process that facilitates optimization of both the diameter of grid openings and the thickness of the dielectric layer thereof. There is also a need for a field emission array fabrication process that reduces the incidence of electrically conductive imperfections that extend from the substrate to the grid and that,thereby, reduces the likelihood of electrical shorts during use of the field emission array.

SUMMARY OF THE INVENTION

The present invention includes a method of fabricating field emission arrays that include planarized grids. The field emission array fabrication method of the present invention employs two dielectric layer disposition processes and two planarization processes on the dielectric layers to facilitate optimization of the size of the grid openings above each of the emitter tips thereof.

According to the present invention, the column lines, emitter tips, and their associated electrical componentry may be fabricated by known processes. A layer of dielectric material, which is also referred to herein as a first layer or as a first dielectric layer, is then disposed over the substrate and the emitter tips. The thickness of the layer of dielectric material is preferably less than the height of the emitter tips. Known processes, such as chemical vapor deposition techniques or oxide growth processes, may be employed to dispose the layer of dielectric material over the substrate and the emitter tips.

Another layer, which is also referred to herein as a second layer, and which includes a material that is preferably planarizable and that is selectively etchable with respect to the dielectric material of the underlying layer and with respect to the material of the substrate and emitter tips, is disposed over the layer of dielectric material. The planarizable, selectively etchable layer may be disposed over the layer of dielectric material by known processes, such as by physical vapor deposition or chemical vapor deposition.

The second layer may be planarized by known processes, such as by chemical-mechanical planarization or chemical-mechanical polishing ("CMP"). Upon planarization of the second layer, portions of the first layer disposed above each of the emitter tips are preferably exposed through the second layer.

Dielectric material of the exposed portions of the first layer may be removed from the top portions of the emitter tips by known processes. For example, the second layer may be employed as an etch mask and the dielectric material of the first layer exposed through the second layer may be etched substantially from at least the top portions of the emitter tips by known processes and with known etchants that Will remove the dielectric material with selectivity over the material of the second layer. Alternatively, a mask may be disposed over the field emission array as known in the art, and the dielectric material that is exposed through the second layer may be removed by known etching processes. Preferably, the etchants employed to remove- dielectric material from the emitter tips will remove the dielectric material with selectivity over the material of the emitter tips.

The material of the second layer may be removed from above the first layer. As the material of the second layer is removed, electrical imperfections such as conductive paths (e.g., pieces of metal or holes) through the dielectric material of the first layer, which are also referred to herein as defects, are preferably confined to the first layer.

Another layer of dielectric material, which is also referred to herein as a third layer or as a second dielectric layer, may be disposed over the first layer and over the exposed portions of the emitter tips. The combined thicknesses of the first layer and the third layer are preferably substantially the same as a desired dielectric layer thickness of the field emission array. As the thickness of the third layer, at least in part, determines the size (e.g., diameter) of the grid openings over each of the emitter tips, the thickness of the third layer preferably corresponds to a desired size of the grid openings. Known dielectric material deposition techniques, such as chemical vapor deposition, may be employed to dispose the third layer over the field emission array.

A layer of semiconductive material or conductive material, which is also referred to herein as a fourth layer or as a grid layer, is disposed over the third layer. The material of the fourth layer is preferably a planarizable material.

The fourth layer may be planarized by known processes, such as by chemical-mechanical planarization or by chemical-mechanical polishing techniques, to form the grid of the field emission array. As the fourth layer is planarized and dielectric material of the third layer is exposed therethrough, grid openings are formed through the fourth layer. Planarization may continue until the grid openings are of the desired size (e.g., diameter).

Dielectric material of regions of the third layer that are exposed through the grid openings and of the first layer and the third layer that contact the emitter tips may be removed through the grid openings by known processes, such as by etching. Preferably, the etchants that are employed to remove dielectric material will etch the dielectric material with selectivity over at least the materials of the substrate and of the emitter tips. The etchants may also be selective for the dielectric material over the material of the fourth layer. If the etchants employed selectively etch the dielectric material of the first and third layers with selectivity over the material of the fourth layer, the fourth layer may be employed as an etch mask. Alternatively, a mask may be disposed over the fourth layer, as known in the art, to facilitate the removal of dielectric material from selected regions of the third layer.

Row lines may then be fabricated by known processes over the planarized grid of the field emission array and the field emission array assembled with other field emission display components, such as an electro-luminescent display screen and housing, as known in the art.

Other features and advantages of the present invention will become apparent to those of skill in the art through a consideration of the ensuing description, the accompanying drawings, and the appended claims.

DETAILED DESCRIPTION OF THE INVENTION

Figure 1:
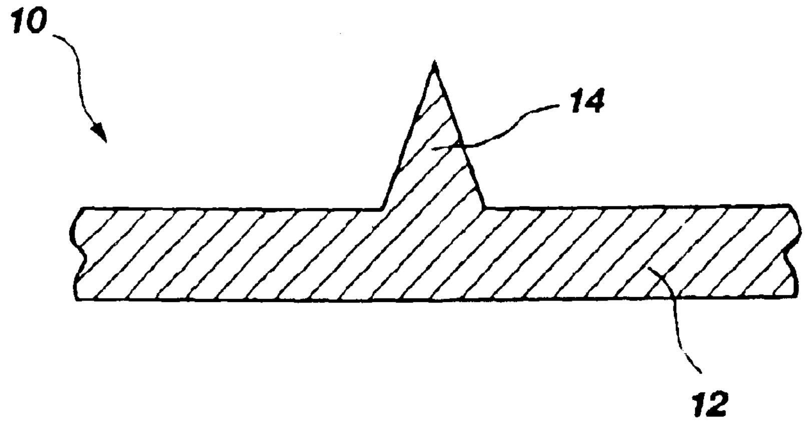
FIG. 1 is a cross-sectional schematic representation of a pixel of a field emission array, depicting a substrate and an emitter tip protruding from the substrate.

With reference to FIG. 1, a field emission array 10 is illustrated that includes a substrate 12 and an emitter tip 14 protruding upwardly from substrate 12. Preferably, substrate 12 and emitter tip 14 comprise a semiconductive material, such as silicon. Alternatively, emitter tip 14 may comprise a different material, either semiconductive or conductive, than the material of substrate 12. Although only a single emitter tip 14 is illustrated in FIG. 1, substrate 12 includes an array of pixels, each of which includes one or more emitter tips 14.

Figure 2:
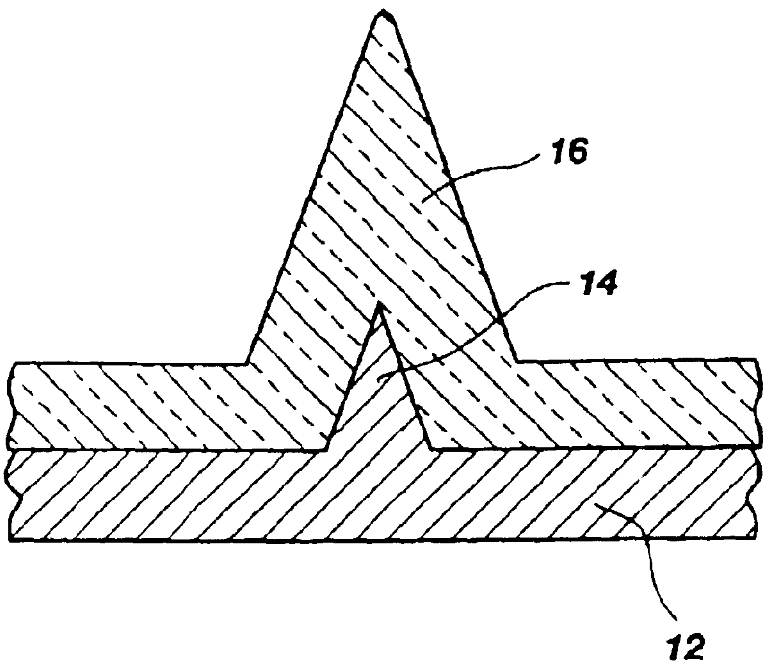
FIG. 2 is a cross-sectional schematic representation of the pixel of FIG. 1, depicting the disposition of a first layer of a dielectric material over the substrate and the emitter tip.

Referring now to FIG. 2, a layer 16 of dielectric material, which is also referred to herein as a first layer or as a first dielectric layer, may be disposed over substrate 12 and emitter tip 14. As illustrated, layer 16 is raised above emitter tip 14. Preferably, the thickness of layer 16 is less than the height of emitter tip 14 so as to facilitate the exposure of layer 16 through the subsequently deposited layer 18 (FIG. 3) during planarization of layer 18. In addition, the thickness of layer 16 preferably facilitates the subsequent definition of a grid opening 26 (see FIG. 9) of desired size.

Layer 16 may comprise any dielectric material, which is also referred to herein as a first dielectric material, that may be employed in fabricating semiconductor devices or field emission arrays, including, without limitation, silicon oxides, oxides, silicon nitrides, borophosphosilicate glass ("BPS G"), phosphosilicate glass ("PSG"), and borosilicate glass ("BSG"). Known techniques, such as growing an oxide, depositing glass, oxide, or nitride (e.g., by chemical vapor deposition ("CVD")), and optionally doping any silicon oxides, may be employed to dispose layer 16 over substrate 12 and emitter tip 14.

Figure 2A:
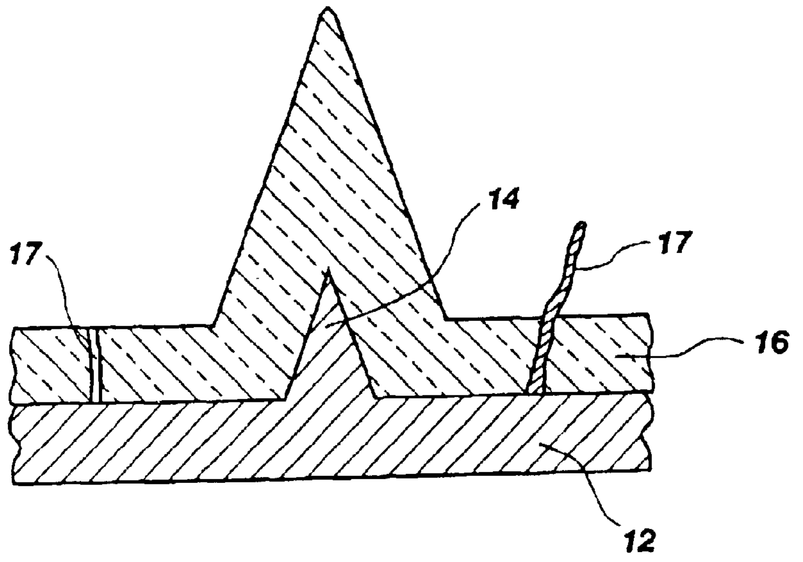
FIG. 2A is a cross-sectional schematic representation of the pixel of FIG. 1, depicting the disposition of a first layer of a dielectric material, including an electrically conductive path therethrough, over the substrate and the emitter tip.

As shown in FIG. 2A, layer 16 may include an electrically conductive path 17 extending substantially therethrough, such as a piece of metal or a hole. If such electrically conductive paths 17 extend substantially through the dielectric layer of a field emission array, electrical shorts may occur between substrate 12, below the dielectric layer, and the oppositely electrically charged grid layer 24, located above the dielectric layer (see FIGS. 9 and 10).

Figure 3:
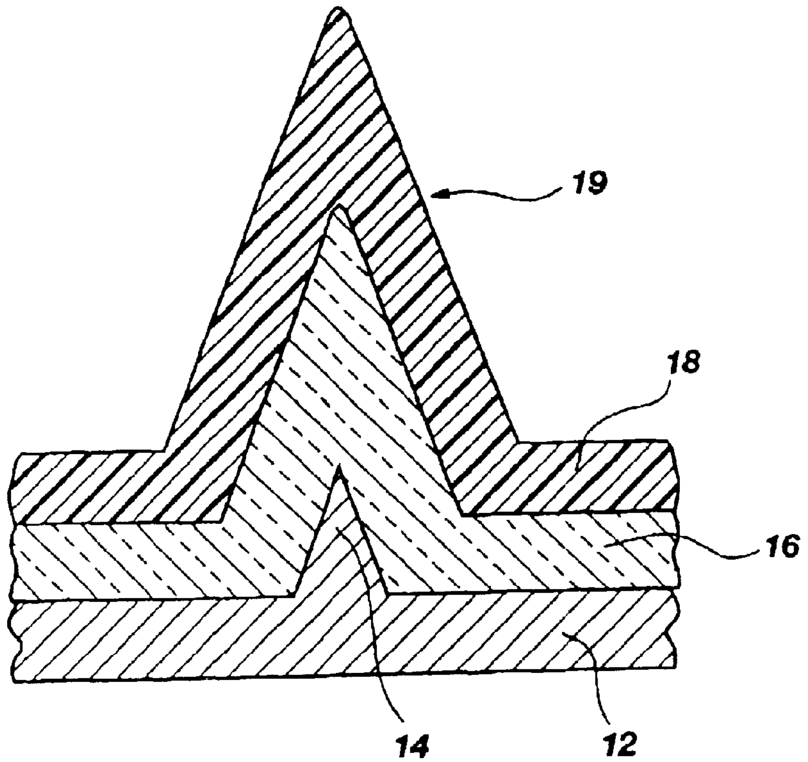
FIG. 3 is a cross-sectional schematic representation of the pixel of FIG. 2, depicting the disposition of a second layer of planarizable material over the first layer of dielectric material.

Turning to FIG. 3, another layer 18, which is also referred to herein as a second layer, is disposed over layer 16. As shown in FIG. 3, since layer 18 has a substantially consistent thickness, layer 18 includes upward protrusions 19 over each emitter tip 14. Layer 18 preferably comprises a material that may be planarized by known processes, such as by chemical-mechanical planarization or chemical-mechanical polishing. In addition, the material of layer 18 is preferably selectively etchable with respect to the dielectric material of layer 16 and with respect to the material of emitter tip 14. An exemplary material that may be employed as layer 18 is chromium, which may be deposited by known sputtering techniques.

Figure 3A:
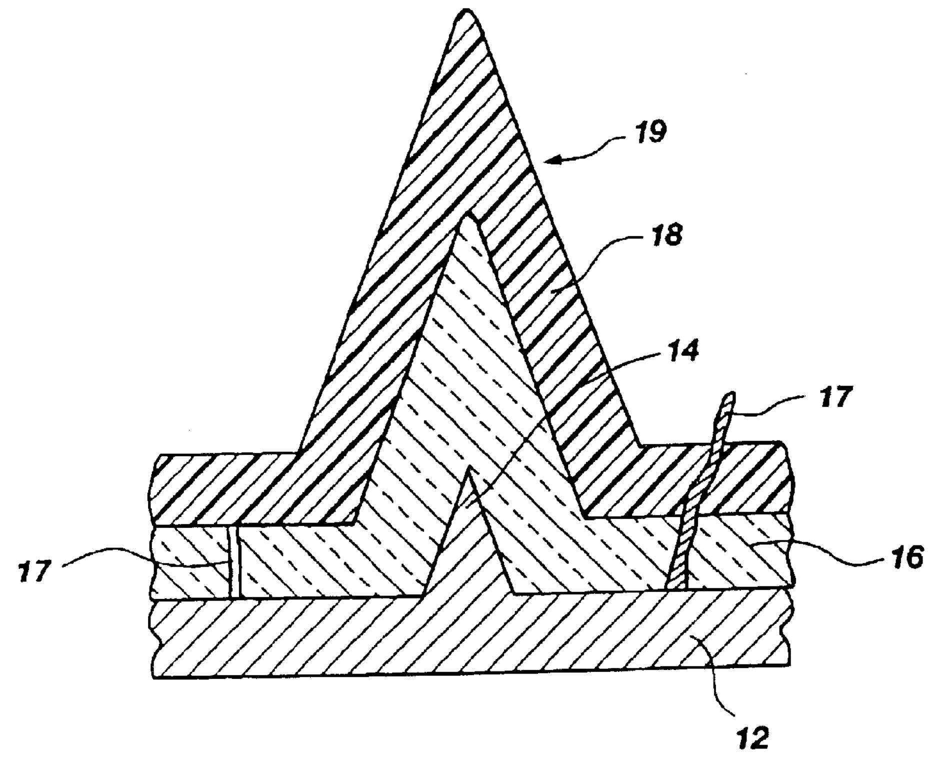
FIG. 3A is a cross-sectional schematic representation of the pixel of FIG. 2A, depicting the disposition of a second layer of planarizable material over the first layer of dielectric material.

As shown in FIG. 3A, any conductive paths 17 (e.g., pieces of metal) that extend through layer 6 may also extend into or through layer 18.

Figure 4:
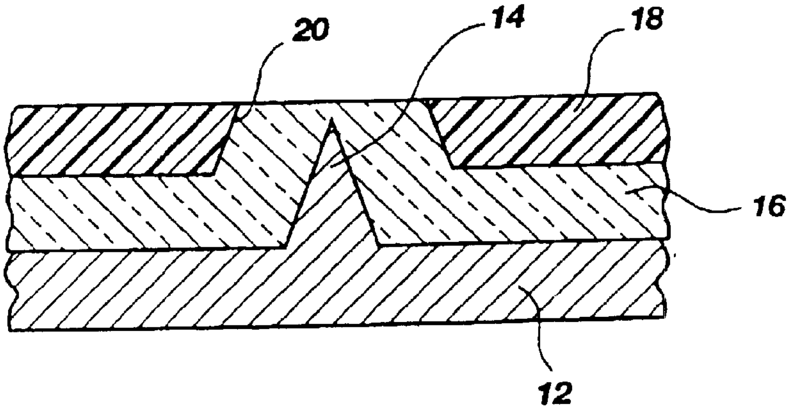
FIG. 4 is a cross-sectional schematic representation of the pixel of FIG. 3, depicting planarization of the second layer.

FIG. 4 illustrates the substantial planarization of layer 18 to remove protrusions 19, to define an opening 20 through layer 18 substantially above each emitter tip 14, and to expose the dielectric material of layer 16 located substantially above each emitter tip 14 through the corresponding opening 20.

Layer 18 may be planarized by known processes, such as by the chemical-mechanical planarization or chemical-mechanical polishing processes disclosed in U.S. Pat. Nos. 4,193,226 and 4,811,522 (hereinafter "the '226 Patent" and "the '522 Patent," respectively), the disclosures of both of which are hereby incorporated in their entireties by this reference. Preferably, layer 18 is planarized such that the combined thickness of layer 16 and layer 18 is at least the height of emitter tip 14.

Figure 4A:
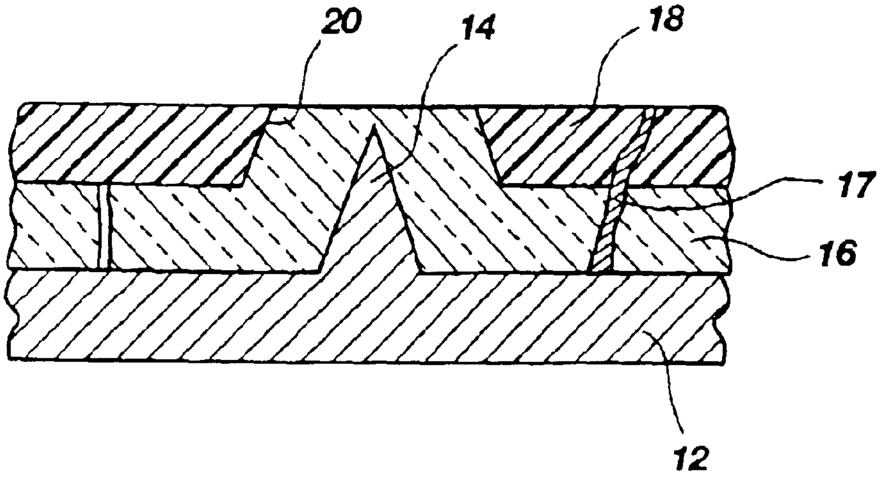
FIG. 4A is a cross-sectional schematic representation of the pixel of FIG. 3A, depicting planarization of the second layer and removal of a portion of the electrically conductive path exposed through the second layer.

As shown in FIG. 4A, portions of any conductive paths 17 that protrude from layer 18 may be removed during the planarization of layer 18.

Figure 5:
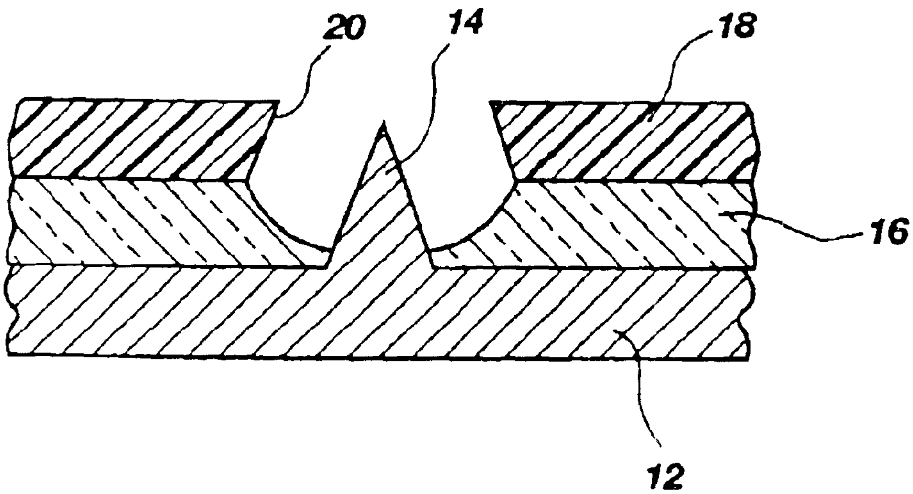
FIG. 5 is a cross-sectional schematic representation of the pixel of FIG. 4, depicting the removal of dielectric material from the surface of the emitter tip through an opening of the second layer.

Referring now to FIG. 5, the dielectric material of layer 16 that is exposed through opening 20 of layer 18 may be removed from above at least a top portion of emitter tip 14 by known processes. For example, an etchant that is selective for the dielectric material of layer 16 over the material of layer 18 or the material of emitter tip 14 may be employed to remove dielectric material through opening 20. When such an etchant is employed, layer 18 may be used as a mask.

Alternatively, a mask may be disposed over layer 18 by known processes, such as by disposing a photoresist material thereover and exposing and developing selected regions of the photoresist. The dielectric material of selected regions of layer 16 may be removed through opening 20 and through a corresponding aperture of the mask. When a separate mask is disposed over layer 18, the etchant that is employed to remove dielectric material from layer 16 need only be selective for the dielectric material over the material of emitter tip 14.

Figure 6:
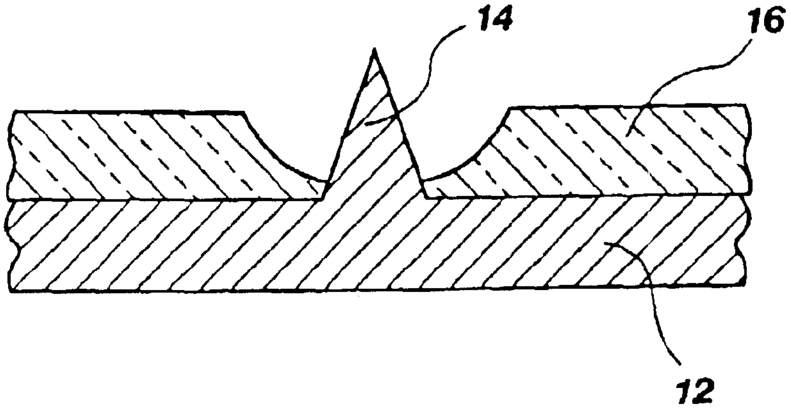
FIG. 6 is a cross-sectional schematic representation of the pixel of FIG. 5, depicting the substantial removal of the second layer from the first layer.

FIG. 6 illustrates the substantial removal of layer 18 (FIG. 3) from layer 16. Layer 18 may be removed from layer 16 by known processes, such as by etching the material of layer 18. If an etchant is employed to remove the material of layer 18, the etchant is preferably selective for the material of layer 18 over the dielectric material of layer 16. As substantially all of layer 18 is removed from field emission array 10, a wet etch process and wet etchants are preferably employed, as the removal of layer 18 may not be selective and wet etchants typically exhibit greater selectivity than comparable dry etchants. Of course, dry etchants may also be employed. After layer 18 has been substantially removed from field emission array 10, any etchants that were employed may be removed from field emission array 10 by known processes, such as by washing field emission array 10.

Figure 6A:
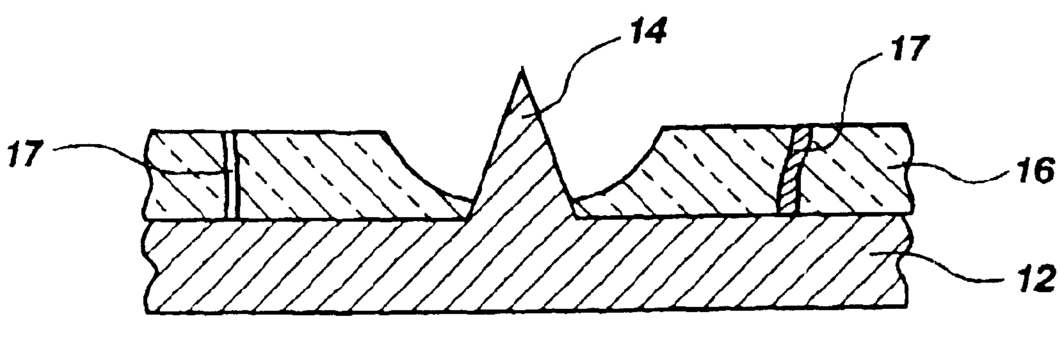
FIG. 6A is a cross-sectional schematic representation of the pixel of FIG. 4A, depicting the substantial removal of the second layer, including the electrically conductive path therethrough, from the first layer.

FIG. 6A shows that any conductive paths 17 that extend into or through layer 18 may be removed substantially to an upper surface of layer 16 during the substantial removal of layer 18 from field emission array 10.

Figure 7:
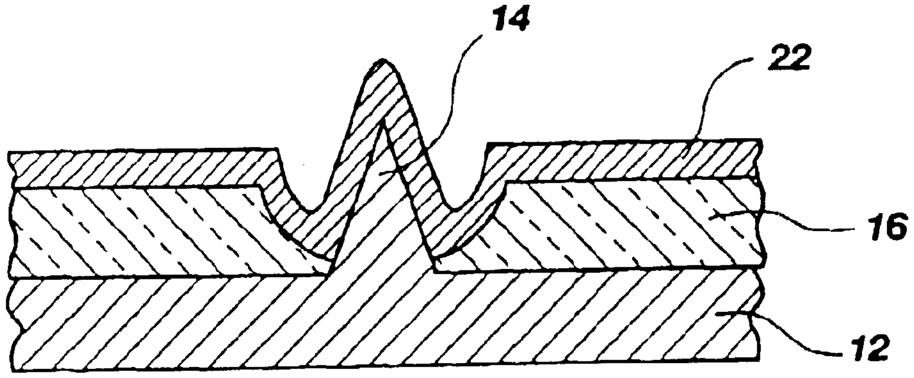
FIG. 7 is a cross-sectional schematic representation of the pixel of FIG. 6, depicting the disposition of a third layer of a dielectric material over the first layer and the exposed portion of the emitter tip.

With reference to FIG. 7, another layer 22 of dielectric material may be disposed over layer 16. Layer 22 is also referred to herein as a third layer or as a second dielectric layer. The regions of layer 22 that are disposed substantially over each emitter tip 14 may protrude from the substantially planar surface of layer 22. The dielectric material of layer 22, which is also referred to herein as a second dielectric material, may be substantially the same material as the dielectric material of layer 16 or a different type of dielectric material than that of layer 16.

Preferably, layer 16 and layer 22 have a combined thickness that imparts field emission array 10 with substantially a desired dielectric material thickness. The relative thicknesses of layer 16 and layer 22 may also be configured to facilitate the formation of a grid opening 26 (see FIGS. 9 and 10) of a desired size (e.g., diameter) above each emitter tip 14, as well as facilitate the fabrication of a grid layer 24 (see FIGS. 9 and 10) a desired height above the top of emitter tip 14.

Layer 22 may comprise any dielectric material that may be employed in fabricating semiconductor devices or field emission arrays, including, without limitation, silicon oxides, oxides, silicon nitrides, borophosphosilicate glass ("BPSG"), phosphosilicate glass ("PSG"), and borosilicate glass ("BSG"). Known techniques, such as growing an oxide, depositing glass, oxide, or nitride (e.g., by chemical vapor deposition ("CVD")), and optionally doping any silicon oxides, may be employed to dispose layer 22 over layer 16 and the exposed portions of emitter tip 14.

Figure 7A:
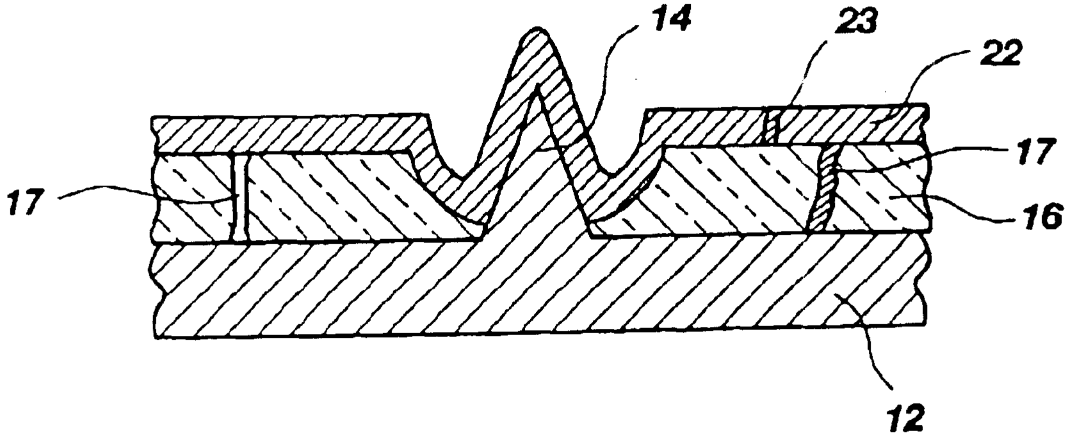
FIG. 7A is a cross-sectional schematic representation of the pixel of FIG. 6A, depicting the disposition of a third layer of a dielectric material over the first layer and the exposed portion of the emitter tip, which may insulate the electrically conductive path that extends through the first layer.

As shown in FIG. 7A, layer 22 may substantially cover and insulate any conductive paths 17 that extend through layer 16. Accordingly, the occurrence of electrically conductive paths through the combination of dielectric layers 16 and 22 is significantly reduced relative to the likelihood that conductive paths will extend substantially through the dielectric material of field emission arrays with a single dielectric layer and cause electrical shorts therethrough. Although layer 22 may also include electrically conductive paths 23 therethrough, the likelihood that conductive paths 23 will align with conductive paths 17 and cause electrical shorts in field emission array 10 is relatively small.

Figure 8:
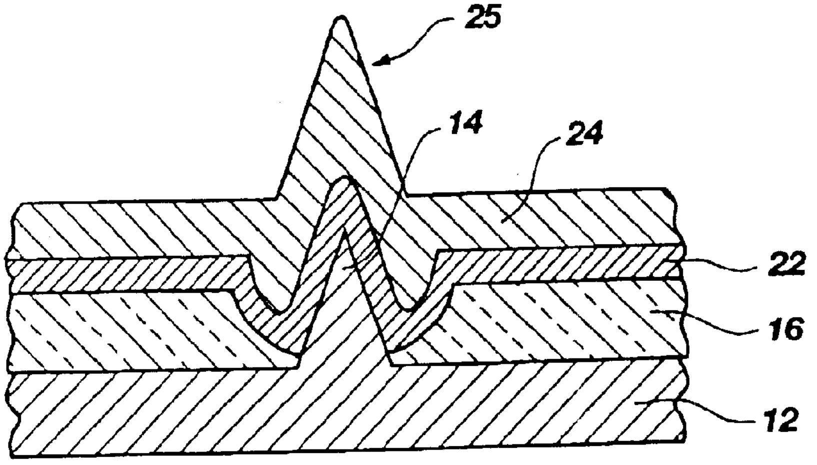
FIG. 8 is a cross-sectional schematic representation of the pixel of FIG. 7, depicting the disposition of a fourth layer of a grid material over the third layer.

FIG. 8 illustrates the disposition of yet another layer 24, which is also referred to herein as a fourth layer or as a grid layer, over layer 22. As layer 22 includes upward protrusions substantially over each emitter tip 14 and layer 24 may be disposed over layer 22 in a substantially consistent thickness, layer 24 may also include protrusions 25 substantially over each emitter tip 14. The material of layer 24 preferably comprises a semiconductive or conductive material that may be employed in fabricating field emission arrays or semiconductor devices. Moreover, the material of layer 24 is preferably a planarizable material, and may withstand etching by etchants of the underlying dielectric materials.

Exemplary materials that are suitable for use as layer 24 include, without limitation, silicon, polysilicon, chromium, aluminum, and molybdenum. The material of layer 24 may be disposed over layer 22 by known techniques, such as by physical vapor deposition ("PVD") processes (e.g., sputtering) or by chemical vapor deposition ("CVD") processes, such as plasma-enhanced CVD ("PECVD"), low pressure CVD ("LPCVD"), or atmospheric pressure CVD ("APCVD").

Figure 9:
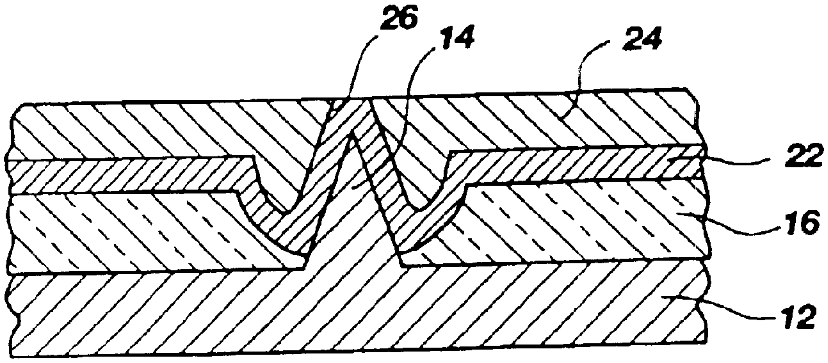
FIG. 9 is a cross-sectional schematic representation of the pixel of FIG. 8, depicting the planarization of the fourth layer to expose the dielectric material of a portion of the third layer disposed above the emitter tip and to form a grid opening through the fourth layer.

Referring to FIG. 9, layer 24 may be substantially planarized to remove protrusions 25, to define a grid opening 26 through layer 24 substantially above each emitter tip 14, and to expose the dielectric material of layer 22 located substantially above each emitter tip 14 through the corresponding grid opening 26.

Layer 24 may be planarized by known processes, such as by the chemical-mechanical planarization or chemical-mechanical polishing processes disclosed in the '226 Patent and in the '522 Patent. Preferably, following the planarization of layer 24, the thickness of layer 24 is substantially a desired thickness for a grid of field emission array 10.

Figure 10:
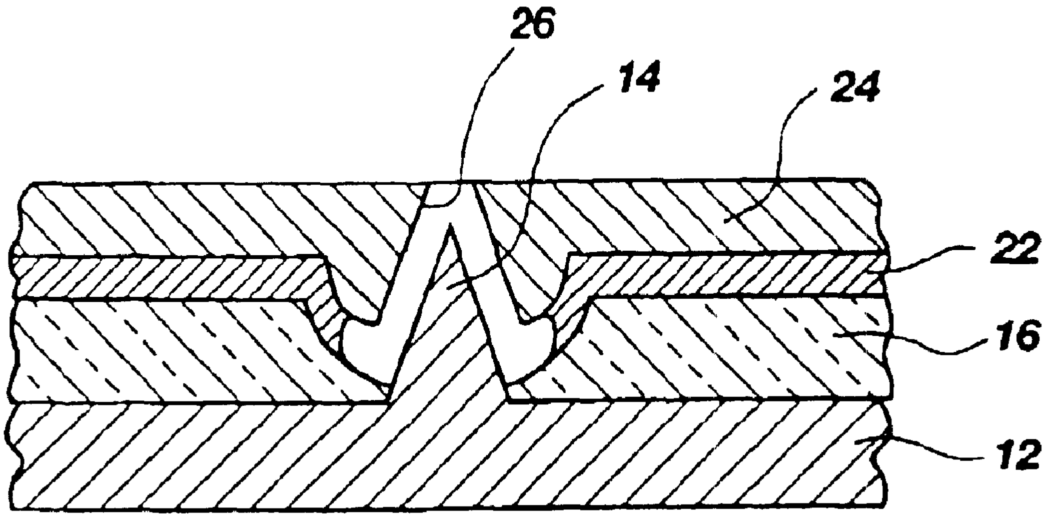
FIG. 10 is a cross-sectional schematic representation of the pixel of FIG. 9, depicting the removal of the dielectric material of a portion of the third layer exposed through the fourth layer and of the dielectric material of the regions of the first layer and the third layer that are adjacent the emitter tip through the grid opening.

Referring now to FIG. 10, the dielectric material of layer 24 that is exposed through each grid opening 26 and the dielectric materials of layer 22 and layer 16 may be removed from each emitter tip 14 by known processes. For example, an etchant that is selective for the dielectric materials of layer 22 and layer 16 over the material of layer 24 and over the material of emitter tip 14 may be employed to remove dielectric material through grid opening 26. When such an etchant is employed, layer 24 may be used as a mask.

Alternatively, a mask may be disposed over layer 24 by known processes, such as by disposing a photoresist material thereover and exposing and developing selected regions of the photoresist, and the dielectric material of selected regions of layer 22 and layer 16 removed through grid opening 26 and through a corresponding aperture of the mask. When a separate mask is disposed over layer 24, the etchant that is employed to remove dielectric material from layer 22 and from layer 16 need only be selective for the dielectric material over the material of emitter tip 14.

The methods of the present invention facilitate the fabrication of a field emission array 10 that has grid openings 26 of substantially any useful size (e.g., less than about 2 μm or about 1 μm). Thus, the method of the present invention may be employed to fabricate a field emission array 10 with an electrically optimized grid opening 26. The method of the present invention may also be employed to tailor and electrically optimize the thickness of the layers of dielectric material 16, 22 and of the grid layer 24.

Although the foregoing description contains many specifics and examples, these should not be construed as limiting the scope of the present invention, but merely as providing illustrations of some of the presently preferred embodiments. Similarly, other embodiments of the invention may he devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for fabricating a field emission structure, comprising:

forming a dielectric layer at least partially around at least one emitter tip;

forming a mask comprising a material which is removable with selectivity over a material of the dielectric layer, at least one aperture of the mask being located substantially over the at least one emitter tip;

removing portions of the dielectric layer that are laterally adjacent to the at least one emitter tip through the at least one aperture;

removing the mask;

forming another dielectric layer adjacent to the dielectric layer;

forming at least a portion of an extraction grid that resides completely over the another dielectric layer; and exposing the at least one emitter tip through the another dielectric layer and the at least a portion of an extraction grid, the dielectric layer and the another dielectric layer remaining in contact with one another.

2. The method of claim 1, wherein forming the dielectric layer comprises forming the dielectric layer to have a thickness which is less than a height of the at least one emitter tip.

3. The method of claim 1, wherein forming the mask comprises forming the mask from at least one of chromium, polysilicon, and molybdenum.

4. The method of claim 1, wherein forming the mask comprises:

depositing a layer comprising mask material; and planarizing the mask material.

5. The method of claim 4, wherein planarizing comprises removing at least a portion of at least one electrically conductive defect that extends through the dielectric layer and into the layer comprising mask material.

6. The method of claim 1, wherein removing portions of the dielectric layer comprises exposing the portions to at least one etchant.

7. The method of claim 1, wherein forming the another dielectric layer comprises forming the another dielectric layer to have a surface which is substantially coplanar with an apex of the at least one emitter tip.

8. The method of claim 1, wherein forming the another dielectric layer comprises covering at least one electrically conductive defect that extends through the dielectric layer.

9. The method of claim 1, wherein exposing comprises:

forming at least one aperture through a conductive or semiconductive layer of at least the portion of the extraction grid, the at least one aperture being in alignment with the at least one emitter tip; and removing portions of the another dielectric layer that are laterally adjacent to the at least one emitter tip through the at least one aperture.

10. The method of claim 9, wherein forming the at least one aperture comprises planarizing the conductive or semiconductive layer.

11. The method of claim 9, wherein removing portions of the another dielectric layer comprises exposing the portions to at least one etchant.

12. The method of claim 9, wherein removing portions of the another dielectric layer is effected without substantially removing remaining portions of the conductive or semiconductive layer.

* * * * *

UNITED STATES PATENT AND TRADEMARK OFFICE

CERTIFICATE OF CORRECTION

PATENT NO. : 6,875,626 B2
APPLICATION NO. : 10/615548
DATED : April 5, 2005
INVENTOR(S) : Ammar Derraa It is certified that error appears in the above-identified patent and that said Letters Patent is hereby corrected as shown below:

In the specification:

| | | |
|---|---|---|
| COLUMN 1, | LINE 63, | change “electro luminescent” to --electro-luminescent-- |
| COLUMN 1, | LINE 67, | change “’973” to --‘973-- |
| COLUMN 2, | LINE 2, | change “’973” to --‘973-- |
| COLUMN 2, | LINE 7, | change “’973” to --‘973-- |
| COLUMN 2, | LINE 16, | change “’973” to --‘973-- |
| COLUMN 2, | LINE 20, | change “’973” to --‘973-- |
| COLUMN 2, | LINE 34, | change “that,thereby,” to --that, thereby,-- |
| COLUMN 3, | LINE 12, | change “that Will” to --that will-- |
| COLUMN 3, | LINE 17, | change “remove- dielectric” to --remove dielectric-- |
| COLUMN 5, | LINE 34, | change “(“BPS G”),” to --(“BPSG”),-- |
| COLUMN 5, | LINE 63, | change “layer 6” to --layer 16-- |
| COLUMN 6, | LINE 7, | change “’226” to --‘226-- |
| COLUMN 6, | LINE 8, | change “’522” to --‘522-- |
| COLUMN 7, | LINE 61, | change “’226” to --‘226-- |
| COLUMN 7, | LINE 62, | change “’522” to --‘522-- |
| COLUMN 8, | LINE 32, | change “may he” to --may be-- |

Signed and Sealed this

Thirteenth Day of November, 2007

JON W. DUDAS

*Director of the United States Patent and Trademark Office*